(12) United States Patent
Tsumura

(10) Patent No.: US 12,477,761 B2
(45) Date of Patent: Nov. 18, 2025

(54) BIPOLAR TRANSISTOR AND SEMICONDUCTOR DEVICE

(71) Applicant: ABLIC Inc., Tokyo (JP)

(72) Inventor: Kazuhiro Tsumura, Tokyo (JP)

(73) Assignee: ABLIC Inc., Nagano (JP)

( * ) Notice: Subject to any disclaimer, the term of this patent is extended or adjusted under 35 U.S.C. 154(b) by 383 days.

(21) Appl. No.: 18/185,400

(22) Filed: Mar. 17, 2023

(65) Prior Publication Data

US 2023/0317836 A1    Oct. 5, 2023

(30) Foreign Application Priority Data

Mar. 29, 2022 (JP) .................................. 2022-052715
Dec. 26, 2022 (JP) .................................. 2022-208377

(51) Int. Cl.
*H10D 10/60* (2025.01)
*H10D 62/13* (2025.01)
*H10D 62/17* (2025.01)

(52) U.S. Cl.
CPC ........... *H10D 10/60* (2025.01); *H10D 62/134* (2025.01); *H10D 62/137* (2025.01); *H10D 62/184* (2025.01)

(58) Field of Classification Search
CPC .... H10D 10/60; H10D 62/134; H10D 62/137; H10D 62/184; H10D 64/519; H10D 62/115; H10D 62/126; H10D 64/281; H10D 84/401; H10D 10/00-891; H10D 84/0107-0109; H10D 89/711-713; H10D 84/961; H10D 64/62
See application file for complete search history.

(56) References Cited

U.S. PATENT DOCUMENTS

| | | | |
|---|---|---|---|
| 12,027,587 B2 * | 7/2024 | Hwang | ................ H10D 62/184 |
| 2005/0184361 A1 | 8/2005 | Sasaki | |
| 2015/0349086 A1 * | 12/2015 | Ting | ...................... H10B 61/22 |
| | | | 438/138 |
| 2019/0078941 A1 * | 3/2019 | Mahon | ................. H10D 62/135 |

FOREIGN PATENT DOCUMENTS

| | | |
|---|---|---|
| JP | 66174368 | 4/1986 |
| JP | 2005236084 | 9/2005 |
| JP | 2010114292 | 5/2010 |

* cited by examiner

*Primary Examiner* — Shahed Ahmed
(74) *Attorney, Agent, or Firm* — JCIPRNET

(57) ABSTRACT

A bipolar transistor is capable of reducing variations in electrical characteristics. A bipolar transistor 100 includes: a collector region 150 which is a predetermined region in a P-type semiconductor substrate 110; a base region 140 which is formed within the collector region 150 and is an N-type well region; a polysilicon 130 formed on the base region 140 via an insulating film 131 and having an outer periphery, as viewed in a plan view, in a rectangular ring shape; and a P-type emitter region 120 surrounded by the polysilicon 130 and formed within the base region 140. The polysilicon 130 includes an extension portion 130a extending inside a contact region 141 of the base region 140 and electrically connected to the base region 140.

11 Claims, 6 Drawing Sheets

BIPOLAR TRANSISTOR AND SEMICONDUCTOR DEVICE

CROSS-REFERENCE TO RELATED APPLICATION

This application claims the priority benefits of Japanese application no. 2022-052715, filed on Mar. 29, 2022, and Japanese application no. 2022-208377, filed on Dec. 26, 2022. The entirety of each of the above-mentioned patent applications is hereby incorporated by reference herein and made a part of this specification.

BACKGROUND

Technical Field

The present invention relates to a bipolar transistor and a semiconductor device.

Description of Related Art

In terms of the bipolar transistors in semiconductor devices, various structures have been proposed so far in order to improve the electrical characteristics. Among the various structures, several bipolar transistors have been proposed, which have nested structures respectively enclosing an emitter region, a base region, and a collector region in this order.

For example, in order to increase the current amplification factor, a bipolar transistor has been proposed, which includes a gate structure composed of a polycrystalline silicon film and a sidewall insulating film between the emitter region and the base region as an isolation structure. In addition, a bipolar transistor has been proposed, in which a salicide region and a salicide offset region are provided on the surface of the base region so that the depletion layer on the base side spreads sufficiently to prevent problems such as leakage current and reduction of junction breakdown voltage.

Some circuits using such bipolar transistors may be greatly affected by even a slight variation in electrical characteristics. For example, for bandgap reference circuits using multiple bipolar transistors, circuits using the ratio of Vbe such as temperature sensors (especially circuits using relative values of Vbe instead of absolute values), etc., it is important to reduce variations in electrical characteristics between bipolar transistors.

SUMMARY

Thus, one aspect of the present invention provides a bipolar transistor capable of reducing variations in electrical characteristics.

A bipolar transistor in accordance with an embodiment of the present invention includes: a collector region which is a predetermined region in a semiconductor substrate of a first conductivity type; a base region which is formed within the collector region and is a well region of a second conductivity type; a first polysilicon which is formed on the base region via an insulating film and an outer periphery of which as viewed in a plan view has a rectangular ring shape; and an emitter region of the first conductivity type which is surrounded by the first polysilicon and is formed within the base region. The first polysilicon includes a first extension portion extending inside a contact region of the base region and electrically connected to the base region.

According to one aspect of the present invention, it is possible to provide a bipolar transistor capable of reducing variations in electrical characteristics.

DESCRIPTION OF THE EMBODIMENTS

Figure 1:
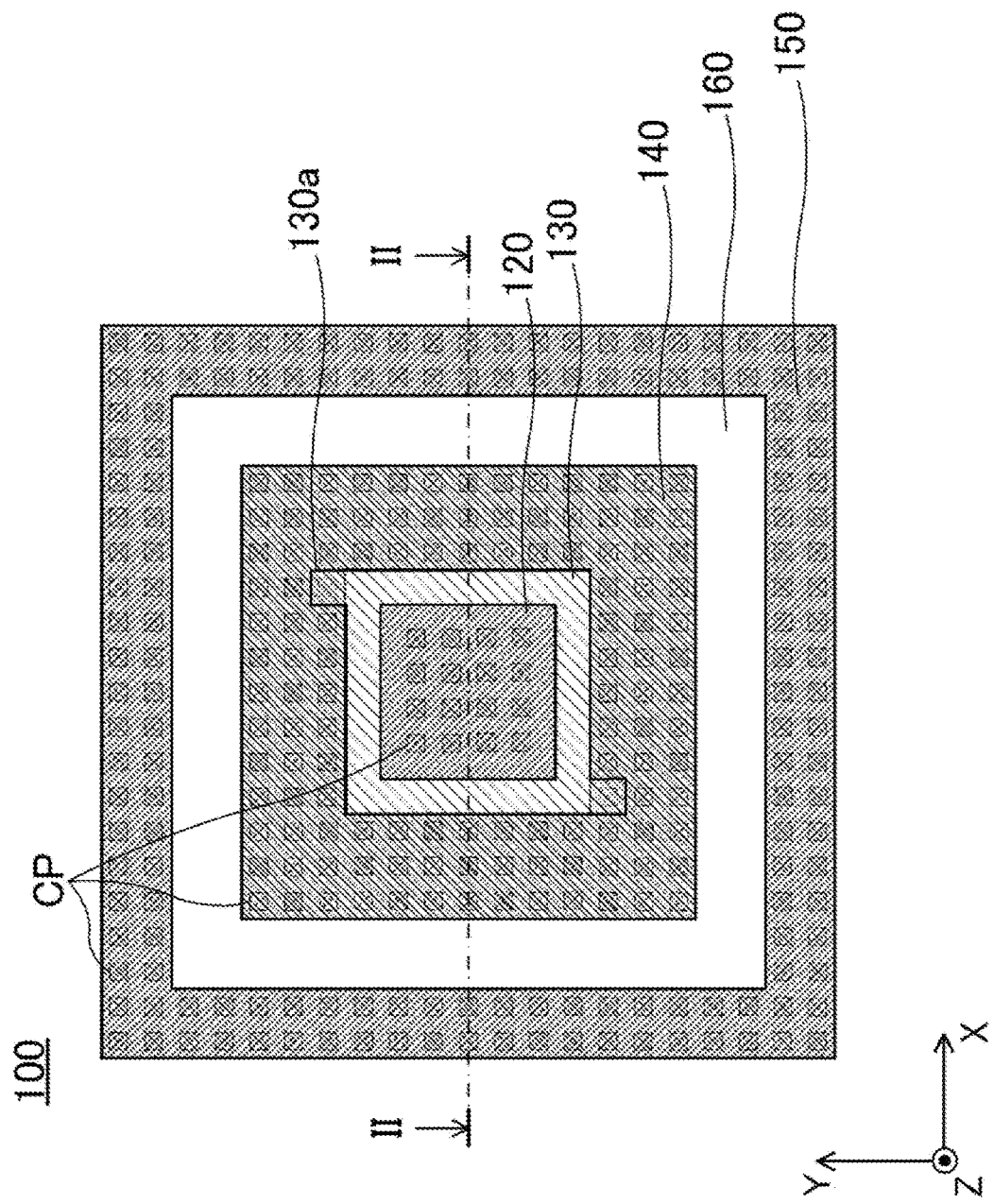
FIG. 1 is a schematic top view illustrating the bipolar transistor according to the first embodiment.

In the conventional bipolar transistor having a nested structure, in order to electrically isolate the boundary of any one of the emitter region, the base region, and the collector region, polysilicon may be provided on the semiconductor substrate at the boundary via an insulating film. In such a case, it is required to apply a voltage to the polysilicon, but in order to avoid damage caused by contact etching in an element formation region, it is common to route the polysilicon to a nearby isolation region and connect with a contact plug in the isolation region.

However, in the case where the polysilicon is routed to the nearby isolation region, the base region in the region where the polysilicon is routed becomes non-uniform, which tends to cause variations in electrical characteristics. Thus, the polysilicon of a bipolar transistor according to an embodiment of the present invention includes an extension portion extending inside the contact region of the base region, and electrically connects the extension portion and the base region on the base region by a polysilicon contact. Thereby, this bipolar transistor can reduce variations in electrical characteristics.

Hereinafter, embodiments of the present invention will be described in detail with reference to the drawings. In the drawings, the same components may be denoted by the same reference numerals, and redundant description may be omitted. In addition, in the drawings, the X direction, the Y direction, and the Z direction are orthogonal to each other. A direction including the X direction and a direction opposite to the X direction (−X direction) is referred to as an "X-axis direction," a direction including the Y direction and a direction opposite to the Y direction (−Y direction) is referred to as a "Y-axis direction," and a direction including the Z direction and a direction opposite to the Z direction (−Z direction) is referred to as a "Z axis direction" (height direction, thickness direction). In this regard, in each of the following embodiments, the surface of each film on the Z-direction side may be called a "front surface." The drawings are schematic, and the width, length, and depth ratios are not as illustrated in the drawings.

First Embodiment

Figure 2:
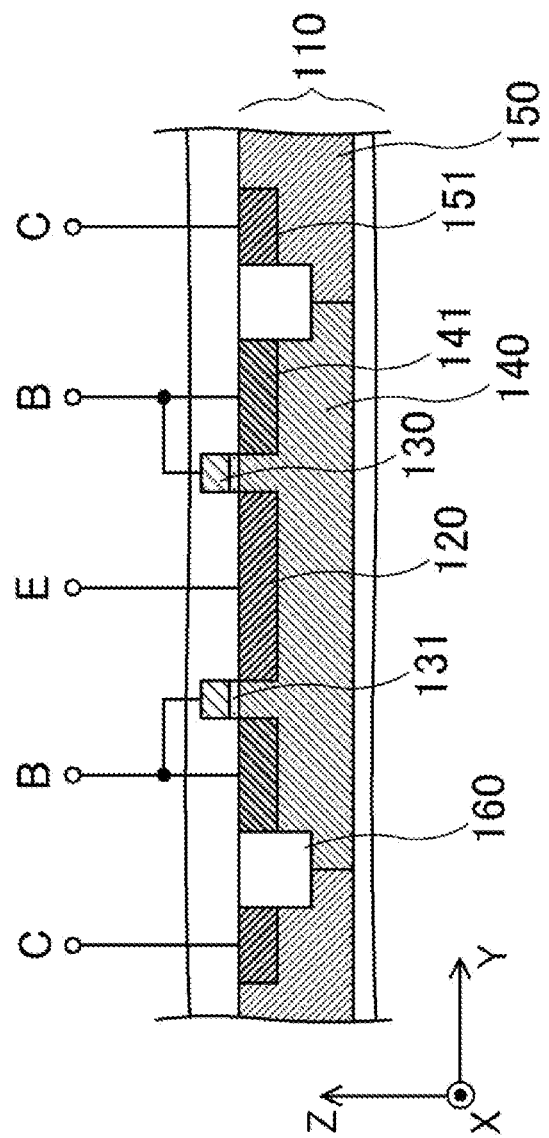
FIG. 2 is an explanatory view illustrating a cross section of the bipolar transistor along the line II-II of FIG. 1.

FIG. 1 is a schematic top view illustrating a bipolar transistor according to the first embodiment. FIG. 2 is an explanatory view illustrating a cross section of the bipolar transistor along the line II-II of FIG. 1. As illustrated in FIG. 1 and FIG. 2, the bipolar transistor 100 includes a semiconductor substrate 110, an emitter region 120, a polysilicon 130, a base region 140, a collector region 150, and an STI (Shallow Trench Isolation) 160. This bipolar transistor 100 includes a structure in which the emitter region 120 and the base region 140 are electrically isolated by the polysilicon 130 having the same potential as the base region 140. Further, the bipolar transistor 100 includes a structure in which the base region 140 and the collector region 150 are electrically isolated by the STI 160. In this embodiment, P type is the first conductivity type, and N type is the second conductivity type.

The semiconductor substrate 110 is a P-type silicon substrate.

The emitter region 120 is formed in a rectangular shape in a plan view by implanting a P-type impurity into the surface of the semiconductor substrate 110 to a high concentration. The emitter region 120 is electrically connected to an emitter electrode E by a plurality of contact plugs CP extending in the +Z direction.

The polysilicon 130 serving as a first polysilicon is formed on the semiconductor substrate 110 via an insulating film 131 such as a silicon oxide film. Since the polysilicon 130 is formed with a predetermined width along the outer periphery of the rectangular emitter region 120, the polysilicon 130 has a rectangular ring shape in a plan view.

Preferably, the polysilicon 130 is implanted with both a P-type impurity and an N-type impurity in a predetermined distribution to a high concentration. Specifically, the impurity distribution of the polysilicon 130 is preferably set so that the vicinity of the emitter region 120 has a high concentration of the P-type impurity, the vicinity of the base region 140 has a high concentration of the N-type impurity, and ½ or more of the polysilicon 130 as a whole is of the N-type. As for the impurity concentration, the polysilicon 130 preferably has a P-type impurity concentration of $1.0^{18}$ $cm^{-3}$ or more in the vicinity of the emitter region 120, and has an N-type impurity concentration of $1.0^{18}$ $cm^{-3}$ or more in the vicinity of the base region 140. Since the band on the surface of the silicon substrate is bent by the polysilicon 130 heavily implanted with the N-type impurity, the current flowing through the surface of the semiconductor substrate 110 can be reduced.

Further, the polysilicon 130 includes an extension portion 130a on a part of the outer periphery. A voltage is applied to the polysilicon 130 by the extension portion 130a rather than by a plurality of contact plugs extending in the +Z direction. In the case where the polysilicon 130 does not include the extension portion 130a on a part of the outer periphery as in this embodiment, the insulating film may be damaged during the manufacturing processes such as contact hole formation, and leakage current may occur between the polysilicon and the semiconductor substrate. Thus, in the case where the polysilicon is connected to the base region, the damage causes the electrical characteristics of the bipolar transistor to change. In order to avoid this, the polysilicon 130 of this embodiment includes the extension portion 130a on a part of the outer periphery.

The extension portion 130a serving as a first extension portion extends inside a contact region 141 of the base region 140 and is electrically connected to the base region 140 by a polysilicon contact. Further, by electrically connecting with the base region 140 at the extension portion 130a, the wiring becomes simple, and current leakage between the base region 140 and the polysilicon 130 can be prevented.

Moreover, the extension portion 130a is preferably arranged at at least one of the four corners of the outer periphery of the polysilicon 130, and is arranged at two of the four corners of the outer periphery in this embodiment. This is because the formation of the extension portion 130a makes the shape of the polysilicon 130 more complicated and the variations in the shape become larger, and by arranging the extension portion 130a at the four corners of the outer periphery where the current density is relatively low, it is possible to suppress the influence of the variations in shape on the variations in electrical characteristics. Furthermore, it is preferable that the extension portion 130a does not reach the outer periphery of the base region 140. This is because, as described above, the formation of the extension portion 130a increases the variations in the shape of the polysilicon 130, so by making the extension portion 130a small enough not to reach the outer periphery of the base region 140, it is possible to suppress the influence of the variations in shape on the variations in electrical characteristics.

The base region 140 is formed in a ring shape along the outer periphery of the polysilicon 130 by implanting an N-type impurity into the surface of the semiconductor substrate 110 to a high concentration. The base region 140 is electrically connected to a base electrode B via the contact region 141 by a plurality of contact plugs CP extending in the +Z direction.

The collector region 150 is formed in a ring shape along the outer periphery of the base region 140 while being spaced apart from the base region 140 by implanting a P-type impurity into the surface of the semiconductor substrate 110 to a high concentration. The collector region 150 is electrically connected to a collector electrode C via a contact region 151 by a plurality of contact plugs CP extending in the +Z direction.

The STI 160 is formed between the base region 140 and the collector region 150 on the surface of the semiconductor substrate 110. Although the isolation region is STI in this embodiment, the isolation region is not limited thereto and may be LOCOS (Local Oxidation of Silicon), for example.

Thus, the bipolar transistor 100 includes: the collector region 150 which is a predetermined region in the P-type semiconductor substrate 110; the base region 140 which is formed within the collector region 150 and is an N-type well region; the polysilicon 130 which is formed on the base region 140 via the insulating film 131 and has an outer periphery, as viewed in a plan view, in a rectangular ring shape; and the P-type emitter region 120 surrounded by the polysilicon 130 and formed within the base region 140. The polysilicon 130 includes the extension portion 130a extending inside the contact region 141 of the base region 140 and electrically connected to the base region 140. Thus, the bipolar transistor 100 electrically connects the extension portion 130a extending inside the contact region 141 of the base region 140 to the base region 140 by a polysilicon contact, thereby eliminating the non-uniformity of the base region in the region where the polysilicon is routed, so variations in electrical characteristics can be reduced.

[Semiconductor Device]

Any device can be appropriately selected as the semiconductor device 10 according to the purpose as long as the device includes the bipolar transistor 100, but it is preferable to include a circuit which utilizes the difference or ratio of the outputs of the bipolar transistors 100 arranged in plurality. Examples of such a circuit include a bandgap reference circuit using a plurality of bipolar transistors 100, a circuit using the Vbe ratio such as a temperature sensor, etc. Specifically, in the case where the semiconductor device 10 includes the bandgap reference circuit described above, since a plurality of bipolar transistors 100 with small variations in electrical characteristics are used, the reference voltage can be output more accurately.

Figure 3:
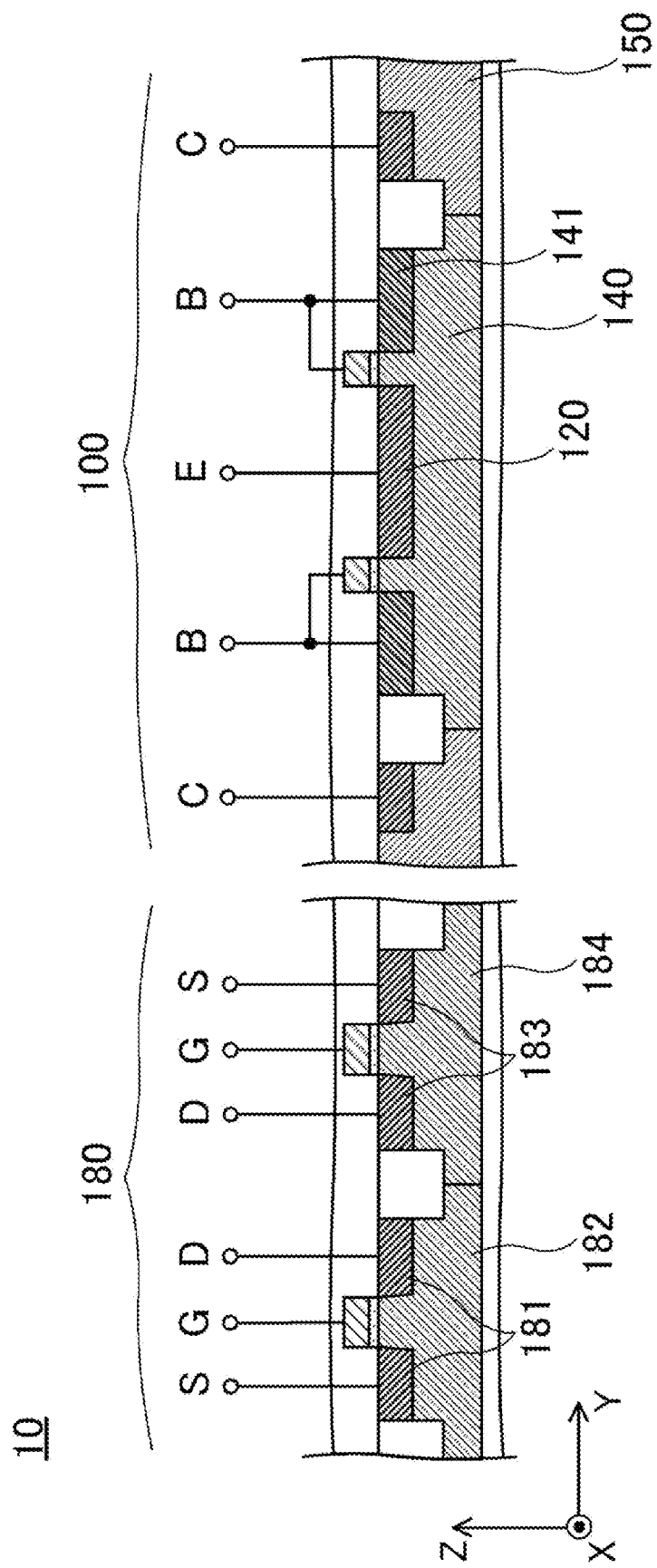
FIG. 3 is an explanatory view illustrating a cross section of the semiconductor device including the bipolar transistor of FIG. 2.

FIG. 3 is an explanatory view illustrating a cross section of the semiconductor device including the bipolar transistor of FIG. 2. As illustrated in FIG. 3, the semiconductor device 10 preferably further includes a CMOS (Complementary metal-oxide-semiconductor) portion 180 in addition to the bipolar transistor 100. This is because the CMOS portion 180 can be formed in the same process as the bipolar transistor 100. Specifically, a well region 184 in the CMOS portion 180 can be formed in the same process of implanting an impurity of the first conductivity type to a low concentration at the time of forming the collector region 150 in the bipolar transistor 100. The source/drain regions 181 in the CMOS portion 180 can be formed in the same process of implanting an impurity of the first conductivity type to a high concentration at the time of forming the emitter region 120 in the bipolar transistor 100. Further, a well region 182 in the CMOS portion 180 can be formed in the same process of implanting an impurity of the second conductivity type to a low concentration at the time of forming the base region 140 in the bipolar transistor 100. The source/drain regions 183 in the CMOS portion 180 can be formed in the same process of implanting an impurity of the second conductivity type to a high concentration at the time of forming the contact region 141 in the bipolar transistor 100.

In the case where the bipolar transistor 100 and the CMOS portion 180 are formed in the same process, from the viewpoint of reducing the factors of manufacturing variations, it may be preferable not to implant an impurity into the emitter region 120 at the time of forming an LDD (Lightly Doped Drain) structure or the like in the MOS transistor of the CMOS portion 180.

Figure 4:
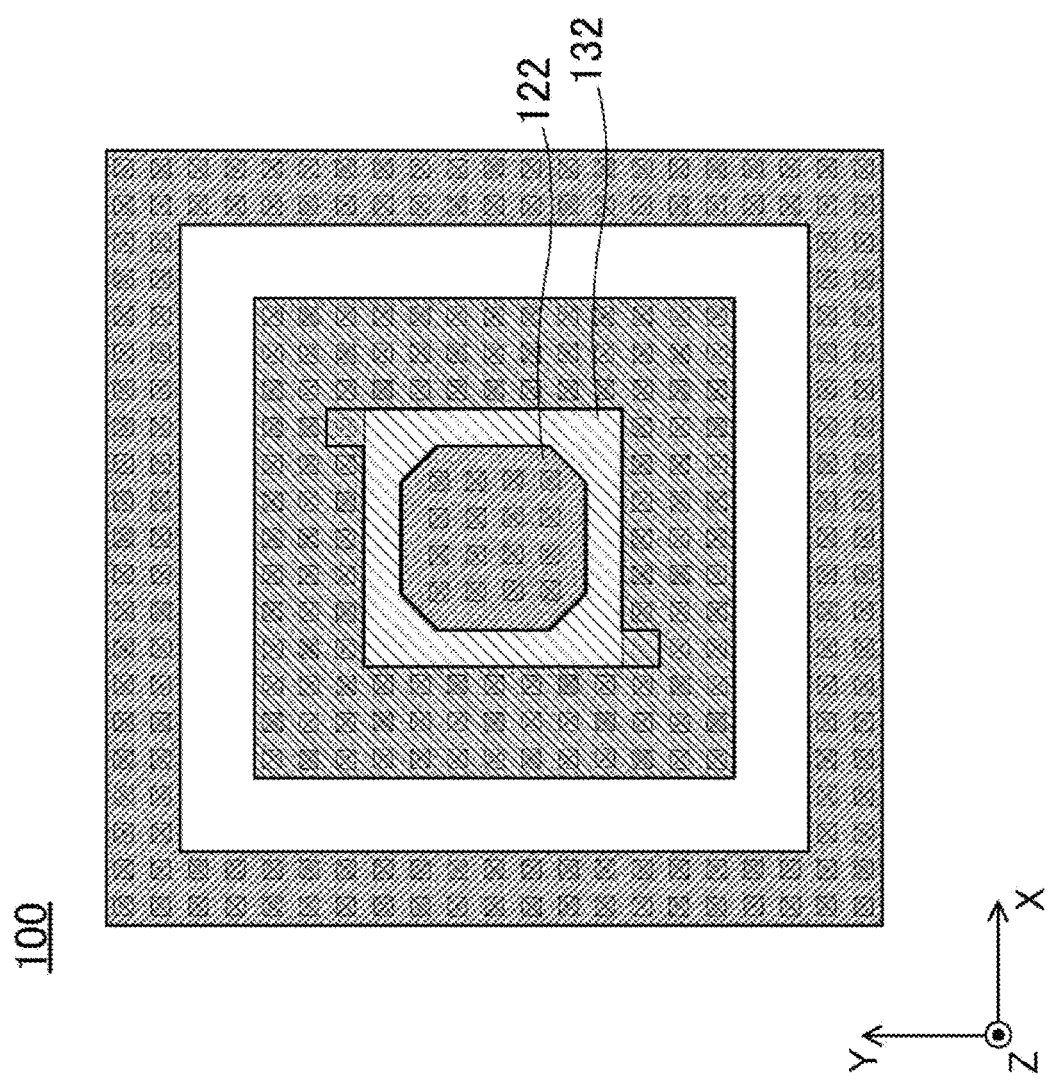
FIG. 4 is a schematic top view illustrating the bipolar transistor according to a modified example of the first embodiment.

FIG. 4 is a schematic top view illustrating the bipolar transistor according to a modified example of the first embodiment. As illustrated in FIG. 4, the modified example is the same as the first embodiment except that the planar shape of the boundary between the emitter region 120 and the polysilicon 130 is changed from a quadrangle to an octagonal emitter region 122 and polysilicon 132.

Since the planar shape of the boundary between the emitter region 120 and the polysilicon 130 in the first embodiment is a quadrangle, in the emitter region 120, the electric field at the corner, which tends to be affected by manufacturing variations, may differ from the electric field not at the corner. Thus, in this modified example, the planar shape of the boundary between the emitter region 122 and the polysilicon 132 is made octagonal to prevent manufacturing variations, so variations in electrical characteristics can be reduced.

Second Embodiment

Figure 5:
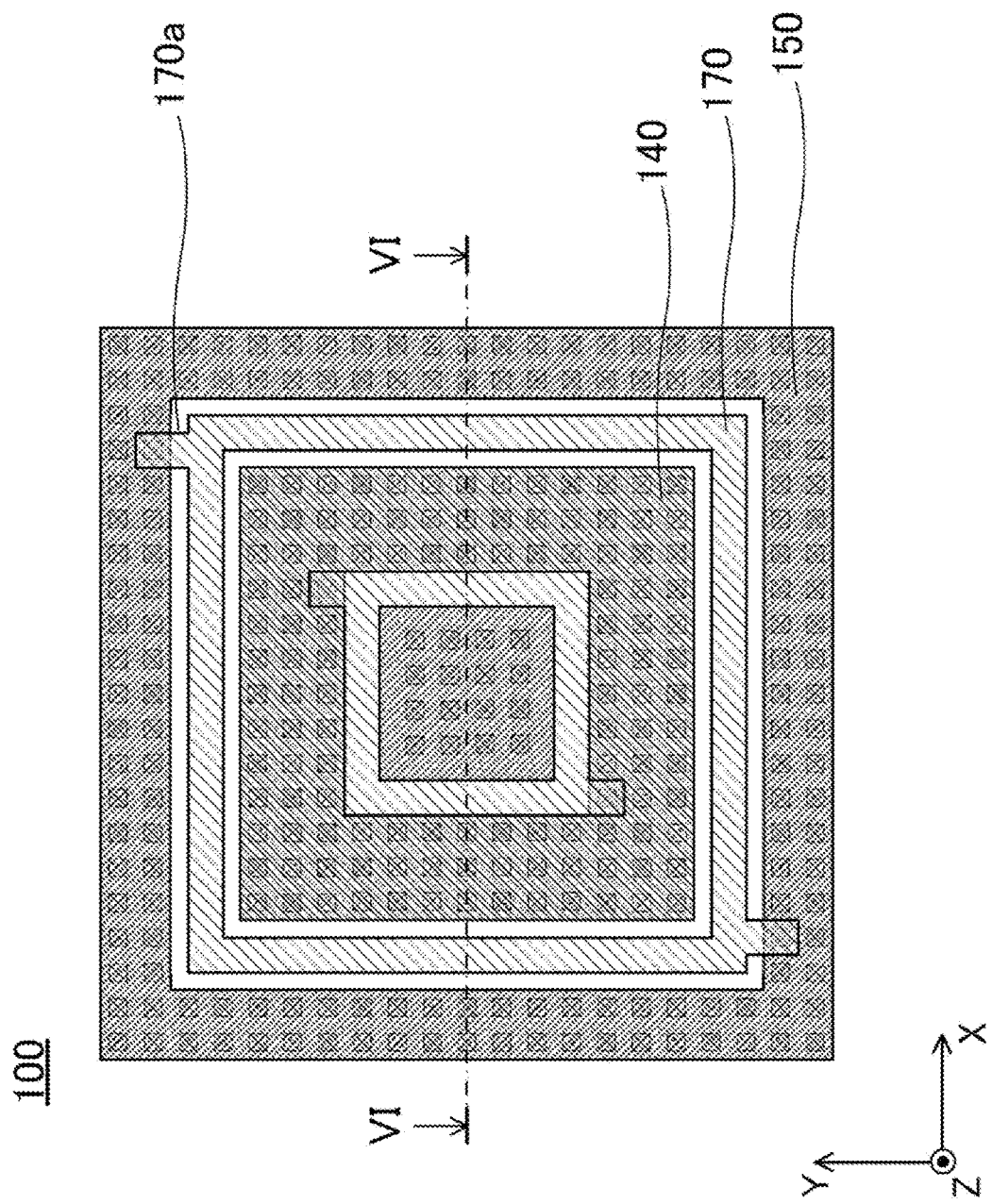
FIG. 5 is a schematic top view illustrating the bipolar transistor according to the second embodiment.
Figure 6:
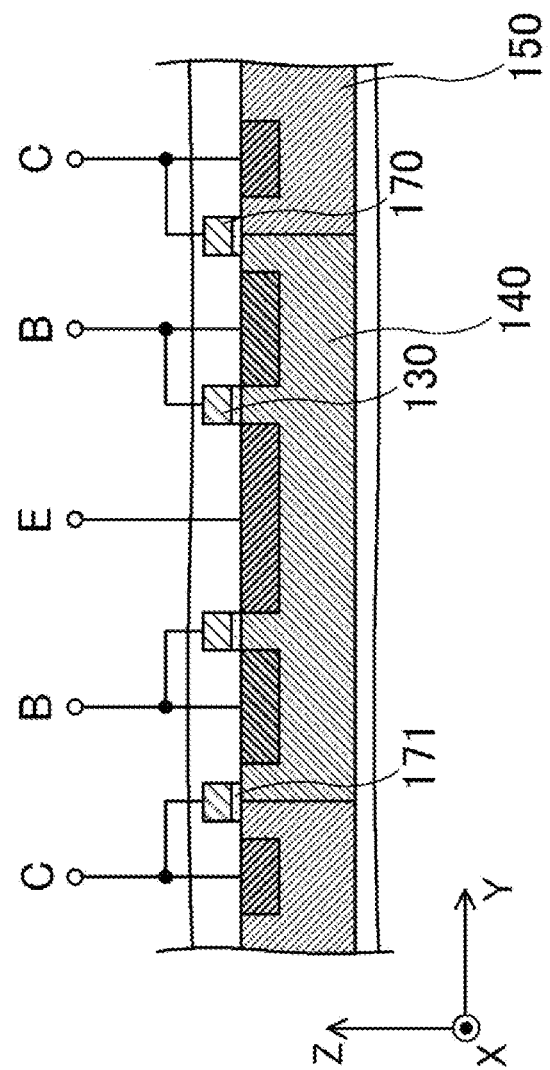
FIG. 6 is an explanatory view illustrating a cross section of the bipolar transistor along the line VI-VI of FIG. 5.

FIG. 5 is a schematic top view illustrating the bipolar transistor according to the second embodiment. FIG. 6 is an explanatory view illustrating a cross section of the bipolar transistor along the line VI-VI of FIG. 5. As illustrated in FIG. 5 and FIG. 6, the second embodiment is the same as the first embodiment except that the STI 160 formed between the base region 140 and the collector region 150 is replaced with a polysilicon 170.

The polysilicon 170 serving as a second polysilicon is formed in a ring shape via an insulating layer 171 such as a silicon oxide film on the semiconductor substrate 110 between the base region 140 and the collector region 150. Since the polysilicon 170 is formed with a predetermined width while being spaced apart from both the base region 140 and the collector region 150, the polysilicon 170 has a rectangular ring shape in a plan view. Like the polysilicon 130, the polysilicon 170 is implanted with both a P-type impurity and an N-type impurity to a high concentration.

In addition, the polysilicon 170 includes an extension portion 170a on a part of the outer periphery. A voltage is applied to the polysilicon 170 by the extension portion 170a rather than by a plurality of contact plugs extending in the +Z direction.

The extension portion 170a serving as a second extension portion extends inside the collector region 150 and is electrically connected to the collector region 150 by a polysilicon contact. Thus, the potential of the polysilicon 170 is fixed, thereby stabilizing the electrical characteristics of the bipolar transistor. In the case where the electrical characteristics of the bipolar transistor are stabilized without fixing the potential of the polysilicon 170, the extension portion 170a is not required and the potential of the polysilicon 170 may not be fixed.

In general, in the manufacture of semiconductor devices, isolated shapes generally tend to increase manufacturing variations, but in the second embodiment, the polysilicon 170 is surrounded with a dummy pattern so that the polysilicon 130 is not isolated, which improves the processing accuracy of the polysilicon 130, so variations in electrical characteristics can be reduced.

As described above, the bipolar transistor according to each embodiment of the present invention includes: a collector region which is a predetermined region in a semiconductor substrate of the first conductivity type; a base region which is formed within the collector region and is a well region of the second conductivity type; a first polysilicon which is formed on the base region via an insulating film and an outer periphery of which as viewed in a plan view has a rectangular ring shape; and an emitter region of the first conductivity type surrounded by the first polysilicon and formed within the base region. The first polysilicon includes a first extension portion extending inside a contact region of the base region and electrically connected to the base region. Thus, the bipolar transistor can reduce variations in electrical characteristics.

In each embodiment, the first conductivity type is P type and the second conductivity type is N type, but the P type and the N type may be exchanged.

What is claimed is:
1. A bipolar transistor, comprising:
a collector region which is a predetermined region in a semiconductor substrate of a first conductivity type;
a base region which is formed within the collector region and is a well region of a second conductivity type;
a first polysilicon which is formed on the base region via an insulating film and an outer periphery of which as viewed in a plan view has a rectangular ring shape; and
an emitter region of the first conductivity type which is surrounded by the first polysilicon and is formed within the base region,
wherein the first polysilicon comprises a first extension portion extending inside a contact region of the base region and electrically connected to the base region.

2. The bipolar transistor according to claim 1, wherein the first extension portion is arranged at at least one of four corners of the outer periphery of the first polysilicon.

3. The bipolar transistor according to claim 1, wherein the first extension portion does not reach an outer periphery of the base region.

4. The bipolar transistor according to claim 1, wherein the first extension portion is electrically connected to the base region by a polysilicon contact.

5. The bipolar transistor according to claim 1, wherein the first polysilicon is implanted with an impurity of the first conductivity type to a high concentration in a vicinity of the emitter region, and is implanted with an impurity of the second conductivity type to a high concentration in a vicinity of the base region.

6. The bipolar transistor according to claim 1, wherein at least ½ or more of the first polysilicon is of the second conductivity type.

7. The bipolar transistor according to claim 1, wherein an outer periphery of the emitter region is octagonal.

8. The bipolar transistor according to claim 1, further comprising a ring-shaped second polysilicon formed at a boundary between the base region and the collector region as viewed in a plan view.

9. The bipolar transistor according to claim 8, wherein the second polysilicon comprises a second extension portion extending inside the collector region and electrically connected to the collector region.

10. A semiconductor device, comprising the bipolar transistor according to claim 1.

11. The semiconductor device according to claim 10, further comprising a CMOS portion.

* * * * *